(12) United States Patent  
Ausserlechner

(10) Patent No.: US 10,466,071 B2  
(45) Date of Patent: Nov. 5, 2019

(54) TRUE-PHASE TWO-DIMENSIONAL MAGNETIC FIELD SENSOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 545 days.

(21) Appl. No.: 14/453,144

(22) Filed: Aug. 6, 2014

(65) Prior Publication Data

US 2016/0041006 A1 Feb. 11, 2016

(51) Int. Cl.
*G01R 33/02* (2006.01)
*G01D 5/14* (2006.01)
(Continued)

(52) U.S. Cl.
CPC ......... *G01D 5/145* (2013.01); *G01D 5/24438* (2013.01); *G01R 33/077* (2013.01); *G01R 33/09* (2013.01)

(58) Field of Classification Search
CPC ........... G01D 5/145; G01D 5/14; G01D 5/12; G01D 5/16; G01D 5/142; G01D 5/2013; G01P 3/487; G01P 3/443; G01R 33/0023; G01R 33/0052; G01R 33/02; G01R 33/093; G01R 33/0047; G01R 33/0206; G01R 33/0283; G01R 33/022; G01R 33/0354; G01R 33/16; G01R 33/032; G01R 33/0358; G01R 33/09; G01R 33/26; G01R 33/445; G01R 33/025; G01R 33/0327; G01R 33/326; G01R 33/38; G01R 33/0356; G01R 33/04
(Continued)

(56) References Cited

U.S. PATENT DOCUMENTS 5,341,097 A * 8/1994 Wu ........................ G01D 5/147  
324/207.12  
7,535,215 B2 * 5/2009 Forster .................... G01D 5/145  
324/165  
(Continued)

*Primary Examiner* — Alesa Allgood  
(74) *Attorney, Agent, or Firm* — Eschweiler & Potashnik, LLC

(57) ABSTRACT

Embodiments relate to magnetic field sensor devices, systems and methods that can more accurately detect edges of a target. In one embodiment, a sensor device comprises a first magnetic field sensor element and a second magnetic field sensor element proximate a target, such as a toothwheel, to sense rotation of the target. The sensor device can be considered a two-dimensional magnetic field sensor in embodiments, in that the first magnetic field sensor element can be sensitive to a first magnetic field component (e.g., the Bx component), and the second magnetic field sensor element can be sensitive to a second magnetic field component (e.g., the Bz component). In other embodiments, sensor system 600 can be a three-dimensional magnetic field sensor. The sensor device can be arranged with respect to the target such that the signal from one or the other of the first and second magnetic field sensor elements can be used to determine a switching threshold depending on whether a detected edge is rising (i.e., transitioning from a gap to a tooth of the toothwheel) or falling (transitioning from a tooth to a gap of the toothwheel).

16 Claims, 8 Drawing Sheets

(51) Int. Cl.
*G01R 33/07* (2006.01)
*G01R 33/09* (2006.01)
*G01D 5/244* (2006.01)

(58) Field of Classification Search
USPC ..... 324/207.11–207.14, 207.21–207.25, 227, 324/228, 232, 259–263
See application file for complete search history.

(56) References Cited

U.S. PATENT DOCUMENTS

| | | | |
|---|---|---|---|
| 8,717,010 B2 | 5/2014 | Ausserlechner et al. | |
| 9,640,753 B2 | 5/2017 | Sun et al. | |
| 2005/0258820 A1 | 11/2005 | Forster | |
| 2009/0001965 A1* | 1/2009 | Ausserlechner | G01D 5/145 324/202 |
| 2010/0019917 A1* | 1/2010 | Kurumado | G01D 5/24428 340/686.3 |
| 2010/0327854 A1* | 12/2010 | Dengler | G01D 5/145 324/207.2 |
| 2011/0089941 A1* | 4/2011 | Sasaki | B82Y 25/00 324/252 |
| 2013/0043863 A1* | 2/2013 | Ausserlechner | G01D 5/145 324/207.2 |
| 2015/0022187 A1* | 1/2015 | Taylor | G01B 7/146 324/207.2 |

\* cited by examiner

TRUE-PHASE TWO-DIMENSIONAL MAGNETIC FIELD SENSOR

TECHNICAL FIELD

Embodiments relate generally to magnetic field sensors, and more particularly to magnetic field position sensor systems and methods for determining the position of a target device (e.g., a camshaft) with high phase accuracy.

BACKGROUND

Position sensors that detect the rotational movement of an object such as a camshaft or crankshaft are known in the art. The sensors can comprise magnetic field sensors that can be used to infer a position of the rotating object based on a measured magnetic field detected by the sensors. The magnetic field sensors can utilize various types of sensor elements, including Hall effect sensor elements (e.g., ordinary Hall plates and/or vertical Hall effect devices), magnetoresistive (MR) sensor elements, such as anistotropic MR (AMR), giant MR (GMR), tunneling MR (TMR), colossal MR (CMR), or others.

Conventional magnetic field position sensors also can be twist-insensitive or twist-sensitive sensors. Twist-insensitive sensors generally are magnetic field sensors that are sensitive to magnetic field components in an air-gap direction (e.g., z-direction, or the direction defining the distance between a sensor element and the target), and in which the sensor output should not change in response to a rotation of the sensor by an arbitrary angle around the z-axis (i.e., air-gap axis). On the other hand, twist-sensitive sensors are magnetic field sensors that are sensitive to magnetic field components in a direction of movement (e.g., x-direction) of an object, such as a soft magnetic target device.

Conventional position sensors suffer from several disadvantages. Generally, they are not robust with respect to background magnetic interference. Additionally, they can have difficulty discriminating a bias magnetic field from the field modulation to be sensed. Importantly, conventional position sensors also can be challenged by magnetic threshold definition, or precisely when the signal should switch between low and high (e.g., in a transition from gap to tooth when a tooth-wheel is used), or vice-versa, as the tooth-wheel rotates. Calibration techniques are known and can be used to improve magnetic threshold definition, but they can be delayed (i.e., not operational immediately from power-on).

SUMMARY

Embodiments relate to magnetic field position sensor systems and methods for determining the position of a target device (e.g., a camshaft) with high phase accuracy.

In an embodiment, a magnetic field sensor system configured to be arranged spaced apart from a target by an air gap distance, the system comprising: a substrate; a first sensor element arranged on the substrate and being sensitive to a magnetic field component in a first direction; a second sensor element arranged on the substrate and being sensitive to a magnetic field component in a second direction different from the first direction; and circuitry configured to indicate a sensed position of the target by comparing a signal derived from the first sensor element with a first threshold if the target moves from a first position to a second position, and comparing a signal derived from the second sensor element with a second threshold if the target moves from the second position to the first position.

In an embodiment, a method comprises providing a magnet field sensor system configured to be arranged spaced apart from a target by an air gap distance, the system comprising: a die, a first sensor element arranged on the die and being sensitive to a magnetic field component in a first direction, a second sensor element arranged on the die and being sensitive to a magnetic field component in a second direction, and circuitry configured to provide an output signal that indicates a sensed position of the target; and configuring the circuitry to: compare a signal derived from the first sensor element with a first threshold if the target moves from a first position to a second position, and compare a signal derived from the second sensor element with a second threshold if the target moves from the second position to the first position. In an embodiment, a sensor system configured to provide an output signal when a target crosses a position, the target being moveable along a path comprising the position, the sensor system comprising: at least one sensor element configured to output a signal, related to the target position, that exhibits a relative extremum; and circuitry coupled to the at least one sensor element and configured to derive a threshold based on the signal from the at least one sensor element, and provide the sensor system output signal when the signal from the at least one sensor element either decreases below the threshold if the relative extremum was a relative maximum or increases above the threshold if the relative extremum was a relative minimum.

BRIEF DESCRIPTION OF THE DRAWINGS

The invention may be more completely understood in consideration of the following detailed description of various embodiments of the invention in connection with the accompanying drawings, in which.

Figure 1:
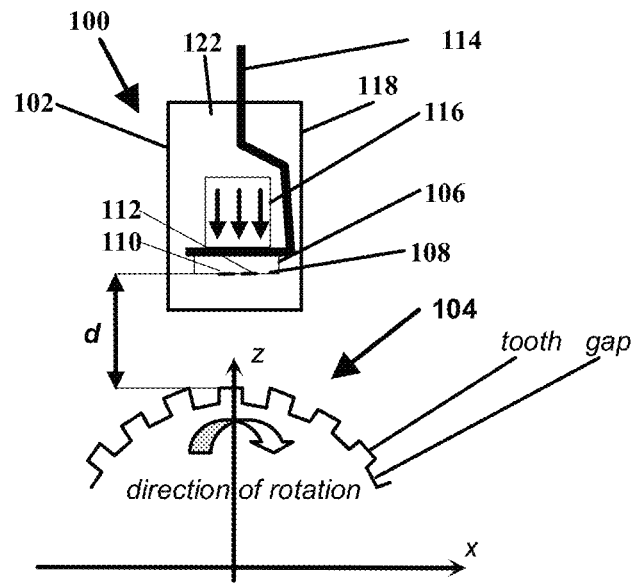
FIG. 1 is a side view diagram of a sensor system and a target according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetic field sensor devices, systems and methods that can more accurately detect edges of a target. In one embodiment, a sensor device comprises a first magnetic field sensor element and a second magnetic field sensor element proximate a target, such as a toothwheel or polewheel, to sense rotation of the target. The sensor device can be considered a two-dimensional magnetic field sensor in embodiments, in that the first magnetic field sensor element can be sensitive to a first magnetic field component (e.g., the Bx component), and the second magnetic field sensor element can be sensitive to a second magnetic field component (e.g., the Bz component). In other embodiments, sensor system 600 can be a three-dimensional magnetic field sensor. The sensor device can be arranged with respect to the target such that the signal from one or the other of the first and second magnetic field sensor elements can be used to determine a switching threshold depending on whether a detected edge is rising (i.e., transitioning from a gap to a tooth of the toothwheel) or falling (transitioning from a tooth to a gap of the toothwheel). In embodiments, the arrangement of the sensor device with respect to the target can be twist-insensitive, and the use of different ones of the first and second magnetic field sensor elements to detect rising or falling edges can provide more accurate and/or consistent edge detection and other advantages.

Though particular components and directions (e.g., x-component, z-direction, etc.) are used herein for purposes of discussion and illustration, they are not limiting with respect to any particular configuration or arrangement of any embodiment, or with respect to the claims. The x-component could be considered to be a first component, for example, with the magnetic field also having second (e.g., y) and third (e.g., z) components.

Referring to FIG. 1, an embodiment of a sensor system 100 is depicted. Sensor system 100 comprises a sensor device 102 and is arranged proximate a target 104. In FIG. 1, target 104 comprises a toothwheel, though a polewheel or other target device can be used in other embodiments. A toothwheel comprises a series of alternating teeth and gaps therebetween, which can be regular (as generally depicted in FIG. 1) or irregular (i.e., with teeth and/or gaps of different sizes or configurations). Target 104, or at least the teeth thereof, comprises a ferrous or other magnetic material in embodiments and is permeable, with a relative permeability, $\mu_r$, of at least 1,000 in embodiments. Target device 150 can be configured to rotate clockwise or counter-clockwise in a tangential direction that is perpendicular to the air-gap direction (e.g., x-direction in as indicated by the arrow in FIG. 1), which will be generally referred to as a "direction of movement" herein. Unless otherwise mentioned, discussed or claimed, the target typically does not comprise part of the sensor system, though they are used in operation together.

Sensor device 102 can comprise a sensor die 106 having a first surface 108 arranged spaced apart from target 104 by an air gap. In embodiments, sensor device 102 and target 104 can be spaced apart from one another in a first direction, which may be referred to as an air-gap direction. Die 106 can be arranged such that first surface 108, i.e., the xy-planar surface facing downwardly toward target 104, is perpendicular with respect to the air-gap direction between sensor device 102 and target 104. In other embodiments, for example, die 106 can be arranged such that first surface 108 is parallel to the air-gap direction. Though referred to herein generally as a die, the term "die" is not limiting with respect to all embodiments and/or the scope of the claims. In various embodiments, die 106 can comprise a substrate, a semiconductor die, a leadframe, a component board, a circuit board, or a combination thereof, or some other support structure capable of establishing and/or maintaining an accurate or relative placement of sensor elements 110 and 112 with respect to each other and/or at least one other component of system 100. Additionally, while die 106 is generally referred to herein in the singular, die 106 or some other support structure of another embodiment can comprise an arrangement of a plurality of dies or other structures or substructures.

Sensor device 102 also can comprise a first magnetic field sensor element 110 and a second magnetic field sensor element 112. In an embodiment, sensor elements 110 and 112 are arranged proximate to and spaced apart from one another on first surface 108 opposite target 104. In the embodiment depicted in FIG. 1, sensor elements 110 and 112 are spaced apart from one another in the x-direction and spaced apart from target 104 by an air gap of a distance d in the z-direction. The particular axis and orientation depicted in FIG. 1 are used herein as an example with respect to how the drawing is arranged on the page and are not limiting to how system 100 can or may be arranged in other embodiments or in practice.

In embodiments, sensor system 100 can comprise a "mono-cell" sensor system, which generally refers to a system in which sensor elements 110 and 112 are arranged to detect a magnetic field component in a single location (i.e., absolute magnetic field measurement). In other embodiments, system 100 can comprise a "differential" sensor system, which generally refers to a system in which sensor elements 110 and 112 are arranged to detect a gradient of a magnetic field component at two or more locations (i.e., measure a difference in a magnetic field component at two or more locations). Differential sensor system embodiments will be discussed herein below and can comprise gradiometers. Gradiometers generally comprise one or more sensor elements configured to detect a gradient of a magnetic field in a direction (e.g., two sensor elements forming a gradiometer can be spaced apart from one another in the x-direction and have a gradiometric direction in the x-direction such that they detect a gradient in the x-direction component of a magnetic field. Embodiments of systems comprising a plurality of gradiometers can be formed, and in such systems the gradiometers can have the same, or parallel, gradiometric directions, or the gradiometers can have different, or antiparallel gradiometric directions.

In an embodiment, sensor element 110 can sense the z-component of the magnetic field induced or influenced by target 104, and sensor element 112 can sense the x-component of the same field. In other words, sensor element 110 is sensitive to the magnetic field perpendicular to surface 108 of die 106, and sensor element 112 is sensitive to the in-plane magnetic field component, parallel to surface 108. These can be reversed in other embodiments and/or other magnetic field components can be sensed by one, both or other sensors elements. Thus, in various embodiments, at least two sensor elements in any sensor system embodiment can have sensitivity directions that are substantially the same or parallel, or that are substantially antiparallel. In antiparallel sensitivity direction embodiments, for example, the directions can intersect to form any angle other than about 0 degrees or about 180 degrees. In one embodiment, the directions can be perpendicular or orthogonal with one another. In embodiments, at least one of the directions can be the same as the air-gap direction (e.g., z-direction in FIG. 1), though in other embodiments both directions can be different from the air-gap direction.

In general, every magnetic field sensor is influenced by any magnetic field component acting on it, in any direction. As discussed herein generally with respect to sensor elements sensing or being sensitive to a particular magnetic field component or direction, what is meant is a class of sensors that are mainly sensitive to a first magnetic field direction and only marginally sensitive to the other magnetic field directions. For example, a Hall plate is mainly sensitive to the magnetic field component perpendicular to the plate; however, it also responds slightly to magnetic field components parallel to the plate and along the direction of current flow, which is known as the "planar Hall effect." Moreover, a Hall plate can have a sensitivity of about 50 mV/V/T for purely perpendicular-to-the-plate fields, yet this may change to about 51 mV/V/T if an additional field of 1 T is applied parallel to the plate. Similar effects are known for magnetoresistors. Thus, by saying that a sensor element is sensitive to a magnetic field in a first direction, this generally refers to the main direction of sensitivity, which is at least one or two orders of magnitude larger than other residual sensitivities or crosstalk.

Sensor elements 110 and 112 can comprise the same or different types of magnetic field sensors, such as Hall effect sensor elements (ordinary Hall plates or vertical Hall effect elements), magnetoresistive sensor elements, MAGFETs or other magnetic field-sensitive devices. In an embodiment in which sensor element 110 senses the z-component and sensor element 112 senses the x-component, sensor element 110 can comprise an ordinary Hall plate, and sensor element 112 can comprise a vertical Hall effect element or a magnetoresistive sensor element. Still other sensor elements can be used for one or both of sensor elements 110 and 112 in other embodiments.

Sensor device 102 can comprise or be coupled to at least one lead 114, which can be coupled to sensor elements 110 and 112 and/or die 106 in order to communicate signals from and/or to sensor elements 110 and 112, die 106 and/or other elements of or in communication with sensor device 102. For example, in one embodiment at least one lead 114 is coupled to die 106 to communicate signals from sensor elements 110 and 112 external to sensor system 100, such as to an electronic control unit (ECU) or other device or circuitry. In the embodiment of FIG. 1, at least one lead 114 is arranged in a bent-lead configuration, though other configurations of lead 114 and/or relative arrangements of lead 114 with die 106 and/or a bias magnet 116 (discussed below) can be implemented in other embodiments.

Sensor device 102 also comprises a bias magnet 116 in embodiments. In other embodiments, bias magnet 116 is not part of sensor device 102 or system 100 and is instead configured to be arranged proximate or coupled to device 102. Generally, bias magnet 116 can be configured to magnetize target 104 and cause a variation in a magnetic field of target 104 when target 104 moves relative to bias magnet 116. Bias magnet 116 can comprise a permanent magnet magnetized as illustrated by the arrows in FIG. 1 (i.e., vertically or in the −z-direction with respect to the orientation of the drawing on the page and the coordinate system used, which can vary in other embodiments or relative configurations of sensor system 100 and target 104). In embodiments, bias magnet 116 can induce a magnetic field that is parallel to the z-axis and air-gap direction. In other embodiments, bias magnet 116 can be magnetized in two directions, in a direction other than that depicted in FIG. 1 or comprise some other type of magnet.

The geometry of bias magnet 116 also can vary in embodiments, with FIG. 1 being but one exemplary embodiment. For example, bias magnet 116 can comprise a generally rectangular shape, a cylindrical shape, a ring magnet, a plurality of magnet elements, or some other suitable shape, configuration or structure specific to an application or system requirement. In embodiments, it can be advantageous for magnet 116 to be symmetrically dimensioned such that a symmetry axis (i.e., z-axis as shown in FIG. 1) of magnet 116 is coaxial with a center of target 104. As depicted in FIG. 1, sensor elements 110 and 112 are arranged between bias magnet 116 and target 104, but other arrangements can be implemented in other embodiments. Generally speaking, it can be advantageous for sensor elements 110 and 112 to be as close to target 104 as possible, such that embodiments in which bias magnet 116 is positioned therebetween can be less attractive.

Sensor device 102 can further comprise a package 118, which can include a protective cover, housing or other integrated circuit packaging structure generally configured to protect sensor device 102 and components thereof and, optionally, mold compound 122 therewithin. Lead 114 and other leads, wires, pads or structures for coupling sensor device 102 with external power supplies, circuits and other devices also can extend from or be formed on or in package 118.

As already discussed, other embodiments can vary from the example embodiment of system 100 depicted in FIG. 1, and some of those embodiments will be discussed and depicted elsewhere herein by way of example. For example, sensor device 102 can comprise two sensor elements 110 and 112 as in FIG. 1, or in other embodiments sensor device 102 can comprise more than two sensor elements, or one or both of sensor elements 110 and 112 can comprise a plurality of sensor elements.

Figure 2A:
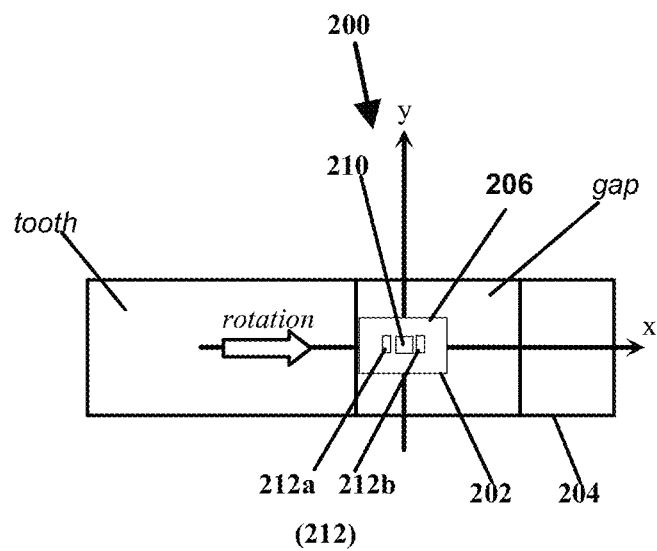
FIG. 2A is a semi-transparent plan view diagram of a sensor system and a target according to an embodiment.

Referring to FIG. 2A, another embodiment of a sensor system 200, similar to sensor system 100, comprises a first sensor element 210, and a second sensor element 212 that comprises second sensor element portions 212a and 212b arranged on a die 206. The term "portion" used herein is not meant to imply that the sensor element portions are not themselves complete physical or functional sensor elements; rather, it is intended to mean that those portions are sensor elements that, together with one or more other sensor elements, can be considered to be part of a sensor element grouping that has a common feature, such as sensing the same component of a magnetic field and, in some embodiments, having their respective signals combined to determine an average, differential or some other resulting signal or estimate. Examples of various sensor element portions are depicted and discussed with respect to various embodiments herein.

Though other arrangements are possible in other embodiments, in FIG. 2A sensor element 210 is arranged between and spaced apart from second sensor element portions 212a and 212b on die 206 in a direction perpendicular to the air-gap direction. As depicted, sensor element portions 212a and 212b are generally symmetric with respect to sensor element 210, and similarly sized and shaped to each other but not necessarily to sensor element 210. Thus, in embodiments the centers of gravity of sensor elements 210 and 212 are generally aligned or arranged at the same point (i.e., the center of gravity of sensor element portions 212a and 212b is between the two, at substantially the same point of the center of gravity of single sensor element 210, which is at its geometric center), such that they can be considered to sense the magnetic field at the same point. This is also true in other embodiments, such as in FIGS. 2B and 2C, 3A, 4 and 5, as well as for other possible embodiments not specifically depicted herein.

Sensor element portions 212a and 212b can sense the Bx component, while sensor element 210 can sense the Bz component. In other words, sensor elements 210 and 212 have different sensitivity directions, and as previously discussed with respect to other embodiments, those directions can be antiparallel (e.g., intersect at any angle other than about 0 degrees or about 180 degrees), such as perpendicular with one another. This is generally the case in other embodiments unless otherwise mentioned.

If sensor element 210 is arranged centered on the z-axis, which extends into the page in the orientation of FIG. 2A, with sensor element portions 212a and 212b arranged symmetrically on either side thereof in the +/−x-directions, an average of the signals of sensor element portions 212a and 212b can provide an estimate of Bx on the z-axis (i.e., at the position that sensor element 210 senses Bz), as discussed above in the context of centers of gravity. Similar to sensor elements 110 and 112, sensor element 110 can comprise an ordinary Hall plate, while sensor element 112 can comprise a vertical Hall effect device or magnetoresistor in an embodiment.

FIG. 2A is a semi-transparent top (plan) view of system 200, such that the general relative arrangement of target 204, die 206 and sensor elements 210 and 212 is similar to that of FIG. 1, even if it appears in FIG. 2A that die 206 is instead arranged between sensor elements 210 and 212 and target 204 (though this is not to say that such an arrangement could not be implemented in other embodiments). Additionally, system 200 can comprise other elements similar to those of system 100 or otherwise that are not specifically depicted (e.g., a bias magnet, package, leads, etc.). Here and throughout, similar reference numerals are used to refer to similar elements (e.g., die 106 and die 206, target 104 and target 204, etc.), though the similar elements may not be identical from embodiment to embodiment. For example, target 104 generally comprises regularly and similarly spaced teeth and gaps as depicted, while target 204 comprises at least one tooth that is wider than an adjacent gap, as illustrated in FIG. 2. Other teeth and gaps of target 204 can be regularly or irregularly sized and/or shaped. The relative sizes of, e.g., sensor device 202 and target 204, and the drawings more generally, are also not necessarily to scale, with adjustments made for purposes of discussion and illustration of examples and features with no limitation on the claims.

Figure 2B:
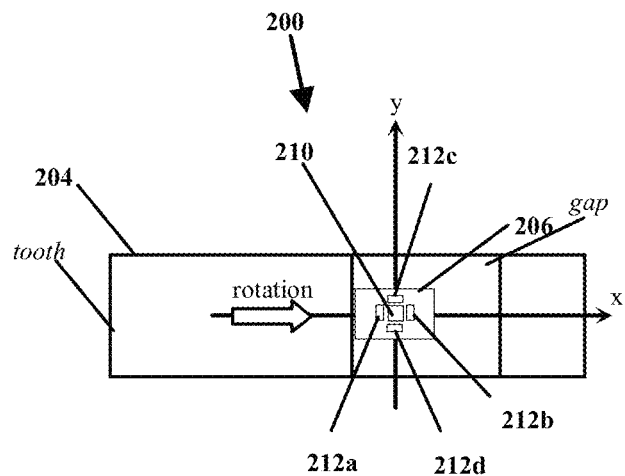
FIG. 2B is a semi-transparent plan view diagram of a sensor system and a target according to an embodiment.

Another embodiment of sensor system 200 is depicted in FIG. 2B, in which sensor element 212 comprises four sensor element portions 212a, 212b, 212c and 212d. Sensor element portions 212a and 212, as in the embodiment of FIG. 2A, are arranged spaced apart from one another along the x-axis. Sensor element portions 212c and 212d are arranged spaced apart from one another along the y-axis, which is perpendicular with both the air-gap direction and the x-axis. In both directions, the pairs of sensor element portions 212a and 212b, and sensor element portions 212c and 212d, are equally spaced from one another and sensor element 210. Each pair of sensor element portions 212a-212b and 212c-212d can be configured to detect magnetic field components along first and second directions, respectively, with the first and second directions being mutually orthogonal magnetic field component directions, and also orthogonal to the sensitive direction of sensor element 210.

The composition and relative arrangement of system 200 in FIG. 2B is such that system 200 is a "twist insensitive" sensor system. In other words, system 200 can be rotated by an arbitrary angle about the twist axis (i.e., the z-axis in FIG. 2B) without affecting the magnetic field detected by first or second sensor elements 210 and 212 (with 212 referring to sensor elements portions 212a-d). In some applications, for example in automotive applications, this can allow for increased flexibility in mounting a sensor system relative to the cylinder head of a combustion engine.

Figure 2C:
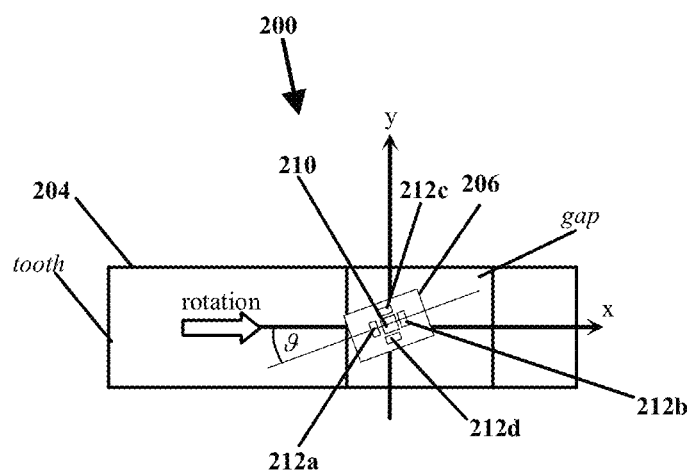
FIG. 2C is a semi-transparent plan view diagram of a sensor system and a target according to an embodiment.

Thus, and referring to FIG. 2C, if substrate 206 is twisted or rotated around the twist axis by an arbitrary twist angle $\vartheta$ (e.g., $\vartheta$=20 degrees as illustrated in FIG. 2C), sensor elements 210 and 212 can be combined to represent the magnetic field component along the direction of movement (i.e., Bx). Sensor system 200 therefore can comprise a three-dimensional (3D) sensor. From the arrangement of FIG. 2C with $\vartheta$=20 degrees, Bx can be reconstructed because it is proportional to:

$$S_{2x} \cos \vartheta - S_{2y} \sin \vartheta$$

where $S_{2x}$ refers to sensor element pair 212a and 212b, and $S_{2y}$ refers to sensor element pair 212c and 212d.

Figure 3A:
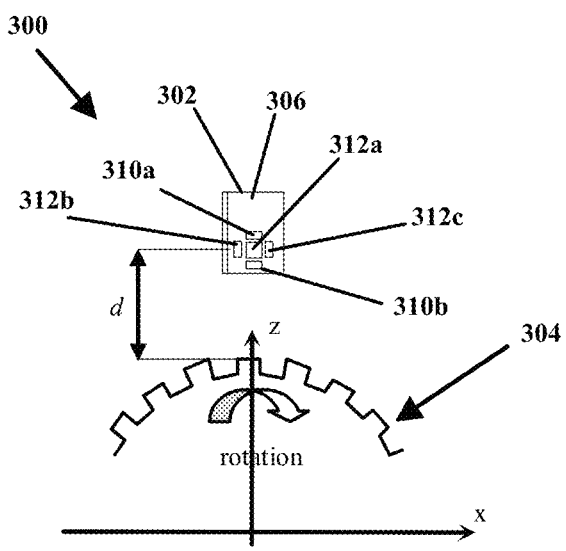
FIG. 3A is a side view diagram of a sensor system and a target according to an embodiment.
Figure 3B:
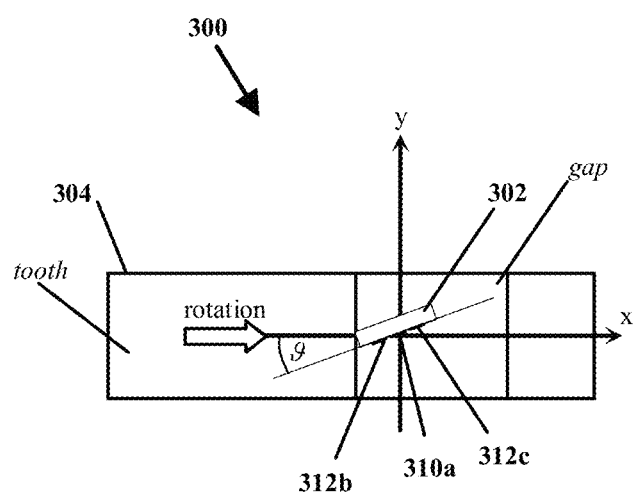
FIG. 3B is a semi-transparent plan view diagram of the sensor system and target of FIG. 3A.

FIGS. 3A (side view) and 3B (plan or top view) depict an embodiment of a sensor system 300 that is similar to sensor system 200 of FIG. 2C but in an upright position configuration. System 300 also can be a twist-insensitive sensor system, here again twisted on the z-axis (as seen most easily in FIG. 3B). In system 300, sensor element 310 for sensing the Bz component comprises two sensor element portions 310a and 310b, and sensor element 312 for sensing the Bx component comprise three sensor element portions 312a, 312b and 312c, with sensor element portions 312b and 312c equidistantly spaced from sensor element portion 312a along the z-axis. Sensor element portions 310a and 310b and are also equidistantly spaced from sensor element portion 312a, though along the x-axis. As can be seen in FIG. 3B, sensor elements 310 and 312 are generally co-planar in the y-direction.

Sensor element 310 can comprise a vertical Hall device or a magnetoresistive device, while sensor element 312 can comprise different types of sensor elements. For example, in one embodiment sensor element portion 310a comprises an ordinary Hall plate, and sensor element portions 310b and 310c comprise vertical Hall devices or magnetoresistive devices. Thus, sensor element portion 312a is sensitive to magnetic field components that are perpendicular to the main surface of die 306 (e.g., the surface on which sensor elements 310 and 312 are mounted, facing generally outwardly from the drawing at a twist angle $\vartheta$ on the z-axis as illustrated in FIG. 3B), while the other sensor element portions 310a, 310b, 312b and 312c are sensitive to in-plane magnetic field components, generally along the short edges of the rectangles of these sensor element portions as depicted in the drawings unless otherwise discussed herein.

Though not specifically depicted, sensor system 300 can comprise other components, including those discussed with respect to other embodiments. For example, sensor device 300 can comprise one or more of a bias magnet, package, leads and other components. For the purpose merely of highlighting features that can differ from system to system or embodiment to embodiment, some of these and/or other features and components may be omitted from one or more drawings, without limitation on any composition of any sensor system or device as claimed. Thus, various embodiments can be directed to combinations and/or variations of features and components depicted and/or discussed with respect to another particular embodiment elsewhere herein.

Figure 4:
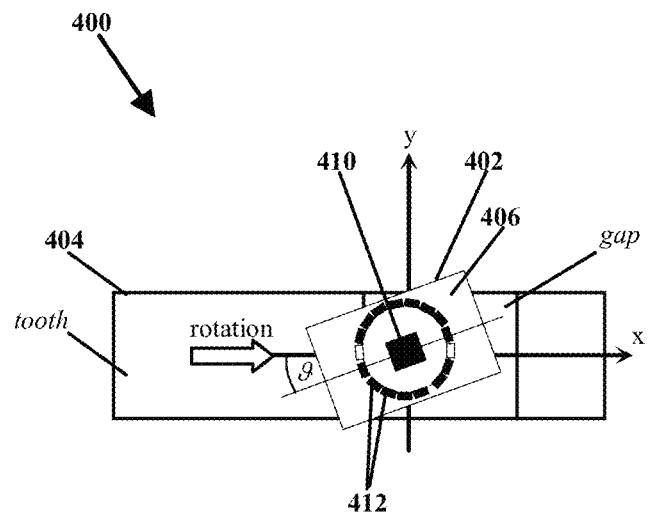
FIG. 4 is a semi-transparent plan view diagram of a sensor system and a target according to an embodiment.

As previously mentioned, embodiments can comprise mono-cell or differential sensor devices. Referring to FIG. 4, an embodiment of a differential sensor system 400 is depicted. Sensor system 400 comprises components and features similar to those of embodiments of sensor systems 200, 300 and 400, with another arrangement of sensor elements 410 and 412 that enables sensing of the gradient of the magnetic field component along the direction (x) of movement of target 404. In such an embodiment, a center of gravity of sensor elements 410 and 412 can define a more precise point at which sensor device 400 switches. In FIG. 4, the center of gravity is the z-axis, on which sensor element 410 is arranged and that defines a center of gravity of the plurality of sensor element portions (which can be more or fewer than the number depicted in FIG. 4) of sensor element 412. The plurality of portions of sensor element 412 in FIG. 4 is arranged generally along a circle centered on the z-axis, with the plurality of portions of sensor element 412 being generally equidistantly spaced from the z-axis and angularly from one another along the circle. Sensor system 400 is also a twist-insensitive system and is mounted a twist angle $\vartheta$ on the z-axis.

In operation, circuitry of or coupled to sensor system 400 can identify diametrically opposed ones of the plurality of sensor element portions of sensor element 412 that lie on a line most in-line with the direction of movement of target 404. In FIG. 4, the two sensor element portions shown in white or unfilled could be those diametrically opposed sensor elements, as both lie generally on the x-axis. In practice, identification of those sensor elements can take place after mounting or installation of sensor system 400, as it is not until that takes place that the relative arrangement of sensor system 400 and target 404 is known. In other embodiments, sensor system 400 or circuitry coupled thereto can interpolate between two or more sensor elements positioned near to the line in-line with the direction of movement of target 404. Simulation results related to operation of an example sensor system like sensor system 400 will be discussed herein below.

A twist-insensitive upright differential sensor system poses additional challenges because the orientation of the main die surface (i.e., the surface on which the sensor elements are arranged) is arbitrary and generally cannot be changed. Thus, any sensor elements that are off the twist axis would be off the x-axis (i.e., the direction of movement of the target) due to arbitrary twist angle. Nevertheless, and referring to FIG. 5, an embodiment of a twist-insensitive upright differential sensor system 500 is depicted. Sensor system 500 comprises an upright orientation similar to that of sensor system 300 in FIGS. 3A and 3B. Sensor system 500 comprises two sensor elements 510 and 512. Sensor element 510 comprises two sensor element portions 510a and 510b, with sensor element portion 510a arranged closer to target 504 than sensor element 510b, spaced apart from one another along the z-axis. Sensor element 512 comprises two sensor element portions 512a and 512b. Sensor element portion 512a is arranged closer to target 504 than sensor element portion 512b, like sensor element portions 510a and 510b spaced apart from one another along the z-axis and arranged between sensor element portions 510a and 510b (i.e., sensor element portion 510a is arranged closest to target 504, and sensor element portion 510b is arranged furthest away from target 504, with sensor element portions 512a and 512b arranged therebetween).

Each of sensor element portions 512a and 512b comprises three sensor element portions spaced apart from one another along the x-axis. The center sensor element portions can each comprise ordinary Hall plates in embodiments, while the two sensor element portions on either side of the center sensor element portions can comprise vertical Hall effect sensor devices or magnetoresistive devices in embodiments. Sensor element portions 510a and 510b also can comprise vertical Hall effect sensor devices or magnetoresistive devices in embodiments.

Figure 5:
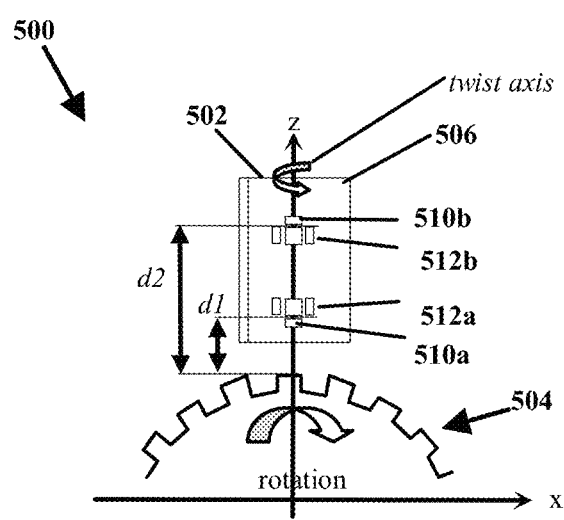
FIG. 5 is a side view diagram of a sensor system and a target according to an embodiment.

In FIG. 5, sensor system 500 is depicted at a twist angle $\vartheta$ on the z-axis (with the orientation of twist angle $\vartheta$ most easily seen in FIG. 4). If the twist angle $\vartheta=0°$, the main surface of die 506 (e.g., the surface facing outwardly in FIG. 5 and on which sensor elements 510 and 512 are mounted) is parallel to the x-axis. Then sensor system 500 can be configured to detect gradients of Bx and Bz, both along the x-direction, i.e., $\partial B_x/\partial x$ and $\partial B_z/\partial x$. This is done by placing the two Bx-sensitive elements of sensor element portions 512a and 512b at different x-positions yet at the same y- and z-positions and subtracting them:

$$dx \times \partial B_x/\partial x \approx B_x(x+dx/2) - B_x(x-dx/2)$$

The same is done for the z-component:

$$dx \times \partial B_z/\partial x \approx B_z(x+dx/2) - B_z(x-dx/2)$$

Since the curl of the magnetic field vanishes, it holds that $$\partial B_z/\partial x = \partial B_x/\partial z$$

which can be measured by placing the two Bx-sensor elements of sensor element portions 512a and 512b at different z-positions yet at identical x- and y-positions. If the sensor element portions 512a and 512b are on the twist axis (i.e., the z-axis), die 506 can be twisted without changing the signal. Sensor system 500 also needs sensor elements that measure two mutually orthogonal components both perpendicular to the twist axis and reconstruct the Bx-field according to $S_{2x} \cos \vartheta - S_{2y} \sin \vartheta$ as discussed above.

For the second gradient we can use the fact that the divergence of the magnetic field vanishes, thus:

$$\partial B_x/\partial x = -\partial B_y/\partial y - \partial B_z/\partial z$$

The total magnetic field can be decomposed into a field generated by the bias magnet and the back-scattering of target 504. For example, for the y-component:

$$B_y = B_y^{(T)} + B_y^{(M)}$$

where the superscript (T) denotes "target structure" and superscript (M) denotes "magnet." If sensor system 500 is placed in the symmetry plane of target 504, it holds that $B_y^{(T)}=0$. Moreover, for any sensor having a gradient in the x-direction, the bias magnet can be designed to have $\partial B_x^{(M)}/\partial x=0$. In the case of a twist-insensitive system, the bias magnet can have rotational geometry in embodiments, such that it also holds that $\partial B_y^{(M)}/\partial y=0$. Thus, we arrive at $\partial B_y/\partial y=0$, which means that $\partial B_x/\partial x=-\partial B_z/\partial z$.

Thus, sensor system 500 can be considered to comprise two 3D sensors (i.e., the first one being 510a and 510b, and the second one being 512a and 512b), with each configured to measure the two orthogonal in-plane magnetic field components and the magnetic field component perpendicular to the main surface of die 506. Each 3D sensor is arranged at a different distance (d1 vs. d2) from target 504 along the air-gap direction (i.e., z-direction), and the differences in magnetic fields are determined to provide two signals: One can be used to detect a more accurate position of rising edges of target 504, and the other can be used to detect a more accurate position of falling edges of target 504.

If the two z-positions are called d1 and d2, the out-of-plane magnetic field component is detected by an ordinary Hall plate (HHall), and the two in-plane components are detected by vertical Hall devices VHallx' and VHallz (with the prime denoting that the x'-direction differs from the x-direction due to the twist angle), then the first signal Sig1 is:

Sig1=Signal(*V*Hallz at *d*2)−Signal(*VH*hallz at *d*1)

The second signal is:

Sig2=Signal(*V*Hallx' at *d*2)*cos(theta)−Signal(*H*Hall at *d*2)*sin(theta)−Signal(*V*Hallx' at *d*1)*cos(theta)+Signal(*H*Hall at *d*1)*sin(theta)

In general, the mono-cell approach can be simpler to implement, use less chip space and have less current consumption, though it may be less robust against magnetic interference than a differential approach. The differential sensor approach can cancel a significant portion of background magnetic field disturbances so that it is more robust, yet it has the disadvantage that it does not work equally well for all possible twist angles: If the lines along which the gradients are detected are along the width direction of the target, this type of sensor can have bad phase accuracy—yet it can be improved significantly if one constructs the gradients along the x-direction by gradients along the z-direction as discussed above.

Thus, in embodiments magnetic field sensor devices, systems and methods can more accurately detect edges of a target. In embodiments, and referring generally to FIGS. 6A and 6B, a sensor system 600 comprises a plurality of magnetic field sensor elements 610/612 (as discussed with respect to the example embodiments of FIGS. 1-5) arranged proximate a target 604, such as a toothwheel, to sense rotation of target 604. Sensor system 600 can be a two-dimensional magnetic field sensor in that a first magnetic field sensor element can be sensitive to a first magnetic field component (e.g., the Bx component), and a second magnetic field sensor element can be sensitive to a second magnetic field component (e.g., the Bz component). In other embodiments, sensor system 600 can be a three-dimensional magnetic field sensor. In embodiments, the arrangement of sensor system 600 with respect to target 604 can be twist-insensitive, and the use of different ones of the first and second magnetic field sensor elements to detect rising or falling edges can provide more accurate and/or consistent edge detection and other advantages.

Figure 6A:
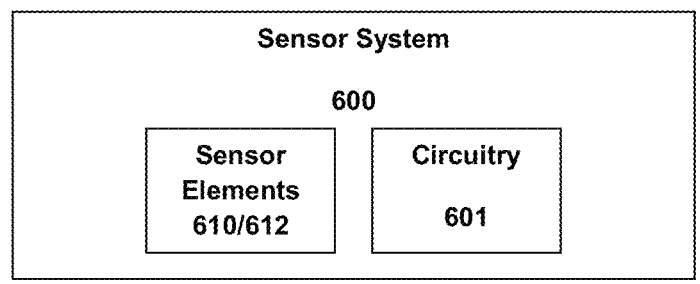
FIG. 6A is a block diagram of a sensor system and a target according to an embodiment.
Figure 6A:
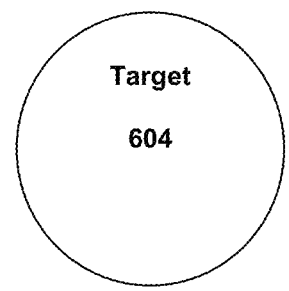
Figure 6B:
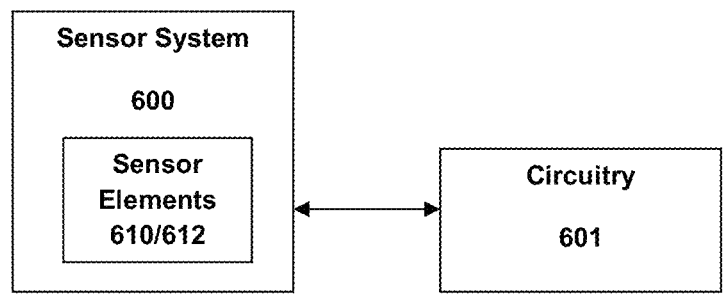
FIG. 6B is a block diagram of a sensor system and a target according to an embodiment.
Figure 6B:
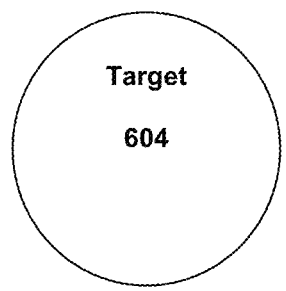

Sensor system 600 can be arranged with respect to target 604 such that the signal from one or the other of the first and second magnetic field sensor elements can be used by circuitry 601 to determine a switching threshold depending on whether a detected edge is rising (i.e., transitioning from a gap to a tooth of the toothwheel) or falling (transitioning from a tooth to a gap of the toothwheel). Circuitry 601 can be part of sensor system 600 (FIG. 6A) or separate from but communicatively coupled to sensor system 600 (FIG. 6B). In the embodiment of FIG. 6A, circuitry 601 can communicate with additional circuitry, such as an electronic control unit (ECU), external to system 600. In the embodiment of FIG. 6B, circuitry 601 also can communicate with additional circuitry, such as an ECU, external to system 600, or circuitry 601 can comprise an ECU or other component or device. In either embodiment, circuitry 601 can comprise memory and other circuitry.

In embodiments, circuitry 601 can store a threshold value or other data and can be configured to process output signals from sensor elements 610/612 to, e.g., determine peak values corresponding to the related magnetic field before and after a rising edge (i.e., gap-to-tooth transition) and a falling edge (i.e., tooth-to-gap transition), respectively, and determining a difference between two consecutive peak values to determine a more accurate transition or switching point. The second value, for example, can be a fixed constant determined during calibration of system 600 or a value measured and stored in circuitry 601 during a preceding operation. In embodiments, the difference between the peak values can be used to derive a threshold value related to a position of target 604 at which a next transition (i.e., a rising or a falling edge) will occur.

A finite element simulation of a sensor system similar to system 400 of FIG. 4 was conducted. In the 3D model, the target was 10 mm wide in the y-direction. Any curvature of the target (e.g., if the target was a target wheel) was neglected, and the target was modeled as a rectangular element 52 mm long in the x-direction. The material of the target was magnetic steel with μr=1700. The target comprised a tooth running from left to right (i.e., in the positive x-direction). The position of the falling edge "tooth->gap" occurred at x=x0. The top of the tooth was at z=0, and the gap was at z=−10 mm. The rectangular brick target emulating a target wheel reached down to z=−20 mm where the boundary condition "magnetic isolation" was applied.

The bias magnet was a hollow cylinder with a 10 mm outer diameter, a 4 mm inner diameter, and a 5 mm axial length. The bottom of the magnet was at z=0.5 mm, which corresponds to an air-gap of 0.5 mm. The magnetization was a mixture of radial and axial magnetization according to:

Brem,*x*=*x*/sqrt(*x*^+*y*^)*cos(theta)

Brem,*y*=*y*/sqrt(*x*^+*y*^)*cos(theta)

Brem,*z*=sin(theta)

with theta=55°

The brick-like structure emulating the wheel was made up of several blocks that made it easier to simulate a moving tooth. A magnet and chip package was surrounded by non-magnetic material with a 5 mm outer diameter that defined the position of the sensor package within the magnet. The tooth was at −15 mm and 4.6 mm and had a high magnetic permeability of μr=1700.

Figure 7A:
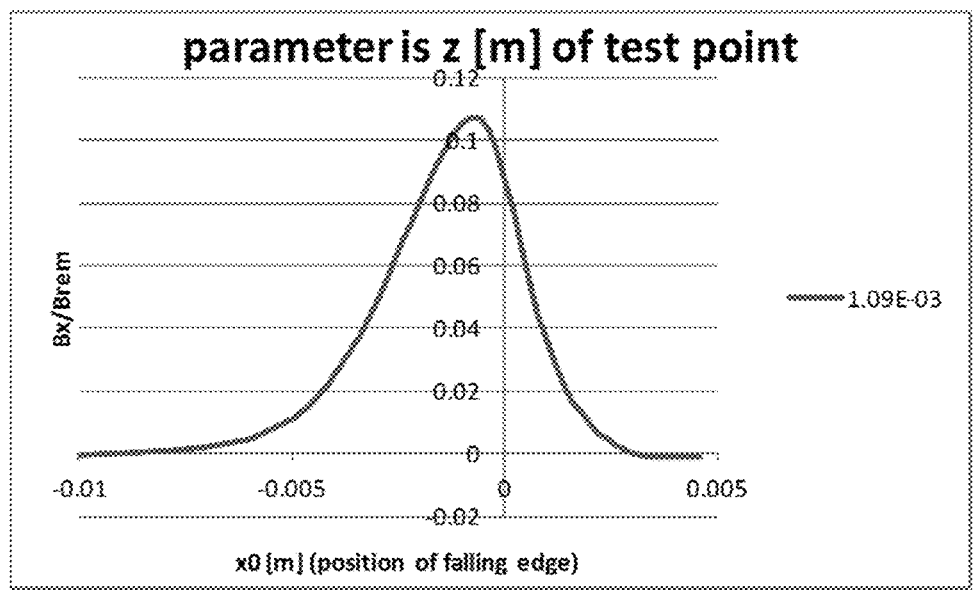
FIG. 7A is a plot of simulation results related to an embodiment similar to FIG. 4.

FIG. 7 shows simulation results of the Bx-field sampled at a test point (x,y,z)=(0,0,1.09 mm) versus position of the tooth. The Bx-field vanishes if the sensor and magnet package is centered above a large tooth or gap, whereas a peak occurs near a transition of tooth-gap or gap-tooth. An important point is that the peak occurs for negative x0-positions, which means that the peak occurs before the tooth-gap transition is directly beneath or proximate the sensor. In this simulation, an ideal threshold at x0=0 is at 82.2% of maximum, with maximum=107.3 mT at x0=−0.8 mm.

Figure 7B:
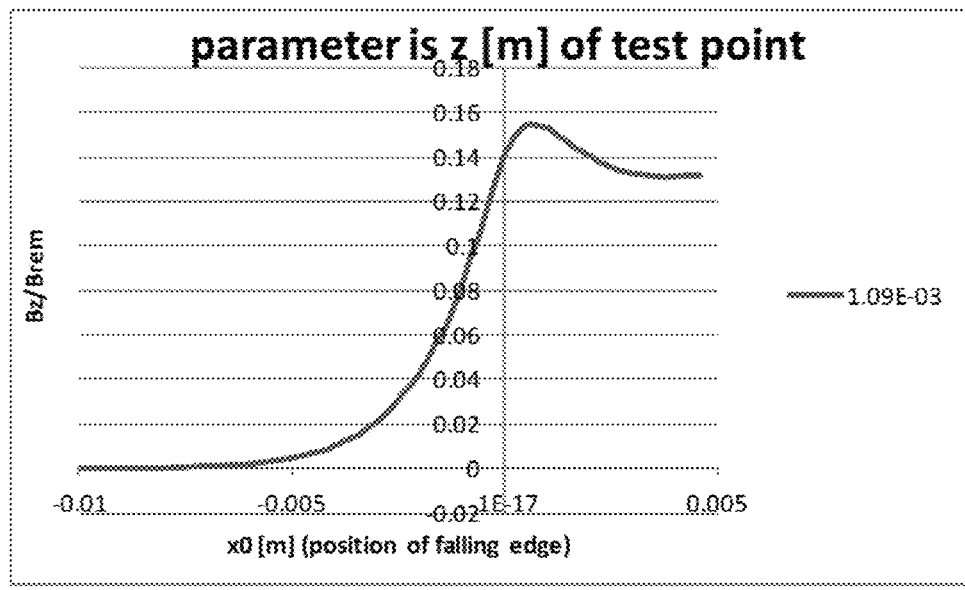
FIG. 7B is a plot of simulation results related to an embodiment similar to FIG. 4.

Contrarily, and referring to FIG. 7B, the peak of the Bz-field occurred shortly after the tooth-gap transition passed directly below the sensor. This also means that the peak occurred before a gap-tooth transition passed directly below the sensor.

Thus, if a rising edge (i.e., a gap-tooth transition) passes underneath the sensor, the Bz-field has a peak before the edge passes the sensor. If a falling edge (i.e., a tooth-gap transition) passes underneath the sensor, the Bx-field has a peak before the edge passes the sensor. Therefore, in both cases the sensor can detect the peak value, and determine a threshold for the next edge that provides more accurate edge detection going forward.

Though there are many applications of sensor systems, devices and methods discussed herein, one example application is an automotive camshaft sensor. A typical but not exclusive cam-wheel outer diameter is 50 mm. Thus, it can be determined by embodiments of sensor systems discussed herein that the peak occurs at least 0.6 mm prior to the edge of the tooth. This is equivalent to 1.375°. If the cam-shaft rotates at a maximum speed of 4000 RPM, this is equivalent to 66.7*360 degrees per second, so that it takes 57 µs for 1.375°. Thus, in embodiments the sensor has to recognize the maximum, compute the threshold and arm the comparator within 57 µs. During start-up, the speed of the cam-shaft is much slower, such that threshold determination can be carried out then.

Figure 8:
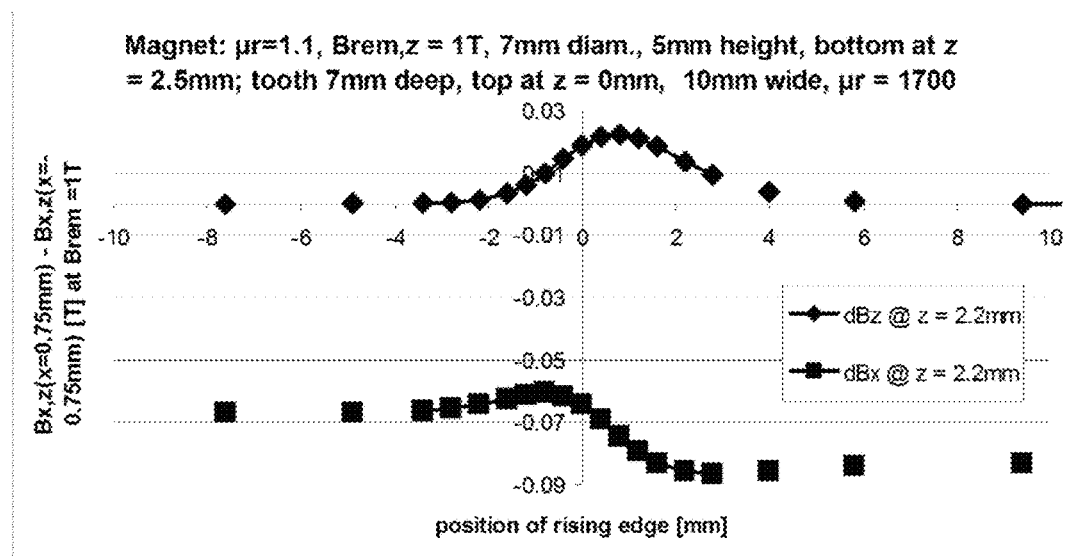
FIG. 8 is a plot of simulation results related to an embodiment similar to FIG. 4.

Referring to FIG. 8, another finite element simulation also was conducted. In this simulation, a plain cylindrical magnet with a 7 mm diameter and 5 mm height was positioned 2.5 mm above a tooth wheel. The bias magnet was magnetized in the z-direction with Brem,z=1 T, and the magnet had a recoil permeability of µr=1.1. The target wheel was 10 mm wide, with the top of the teeth at z=0 and the top of the gaps at z=−7 mm, and the target wheel had a permeability of µr=1700. A gap ran in the positive x-direction so that the gap-tooth edge was given on the abscissa of the plot of FIG. 8 as "position of rising edge."

The sensor system comprised two sensor elements responsive to Bx-fields at the locations x=+0.75 mm and x=−0.75 mm. Sensor circuitry combined their signals to obtain a signal proportional to Bx(x=0.75 mm)−Bx(x=−0.75 mm), which is a gradiometer in the x-direction responsive to Bx-field gradients. The sensor system also comprised two sensor elements responsive to Bz-fields at the locations x=+0.75 mm and x=−0.75 mm. Sensor circuitry combined their signals to obtain a signal proportional to Bz(x=0.75 mm)−Bz(x=−0.75 mm), which is a gradiometer in the x-direction responsive to Bz-field gradients. All sensor elements were located at z=2.2 mm, which is 0.3 mm lower than the bottom surface of the magnet.

The sensor system was attached to the bottom of the bias magnet with a main surface parallel to the bottom surface of the magnet (i.e., parallel to the x-y-plane). In such an embodiment, the Bz-sensor elements can be MAGFETs or ordinary Hall plates, and the Bx-sensor elements can be vertical Hall effect devices or magnetoresistive sensor elements (e.g., AMRs, GMRs, TMRs, etc.).

It is also possible to arrange the sensor system in a top-read configuration such that a main surface is parallel to the x-z-plane. Then the bias magnet can be slightly modified in order to comprise a cavity in which the sensor resides. This can change the magnetic field slightly, yet it can be compensated for by modifying a geometry and/or magnetization pattern of the magnet. In this case the Bx-sensor elements and the By-sensor elements can be Vertical Hall effect devices or magnetoresistive sensor elements, for example.

A significant difference between the first simulation and this second simulation is that the former comprised absolute field sensors for Bx and Bz components, whereas the latter comprised differential field sensors (or gradiometers) for Bx and Bz.

The gradiometer signals are depicted in the plot of FIG. 8. It is noted that both signals exhibited a peak when the edge passed right below the center of the sensor, yet with the difference that the Bx gradiometer (with label dBx) reached the peak before the edge passed the sensor, whereas the Bz gradiometer (with label dBz) reached the peak after the edge passed the sensor. Thus, the dBx signal can be used to determine the position of a rising edge (i.e., a transition from gap to tooth along the positive x-direction) running in the positive x-direction, whereas the dBz signal can be used to determine the position of a falling edge (i.e., a transition from tooth to gap along the positive x-direction) running in the positive x-direction.

If the target wheel direction of movement is the reverse direction, the roles of the dBx and dBz signals need to be swapped: If a rising edge (i.e., a transition from gap to tooth along the positive x-direction) moves into the negative x-direction, the sensor system can determine the instant when the edge passes right underneath the sensor by use of the dBz signal.

Note that dBz has a well-defined low level at 0 mT, whereas dBx has a low level at about −0.067 T when a tooth is underneath the sensor and about −0.085 T when a gap is underneath the sensor. The reason is that the magnet modeled in the simulation was very simple, such that its fluxlines diverged when they passed though the sensor elements; this gives negative Bx at a negative x-position and positive Bx at a positive x-position such that dBx is different from zero. The presence of the tooth forced the fluxlines to converge at their entry into the iron, which reduced the magnitude of dBx over the tooth in contrast to the position over the gap. It is possible, however, to shape the magnet such that dBx is zero over teeth and gaps and the dBx-signal also has 0 mT at zero-line just like the dBz-signal. One way to achieve this is to cut out a cavity or stud hole at the bottom surface near the symmetry axis of the magnet.

If an edge approaches the sensor, both signals dBx and dBz rise. The signal that reaches the peak first is to be used in the edge detection. For example, if the dBx signal reaches the peak before the dBz signal, either a rising edge moving into positive x-direction has passed the sensor or a falling edge moving into negative x-direction has passed the sensor.

Figure 9:
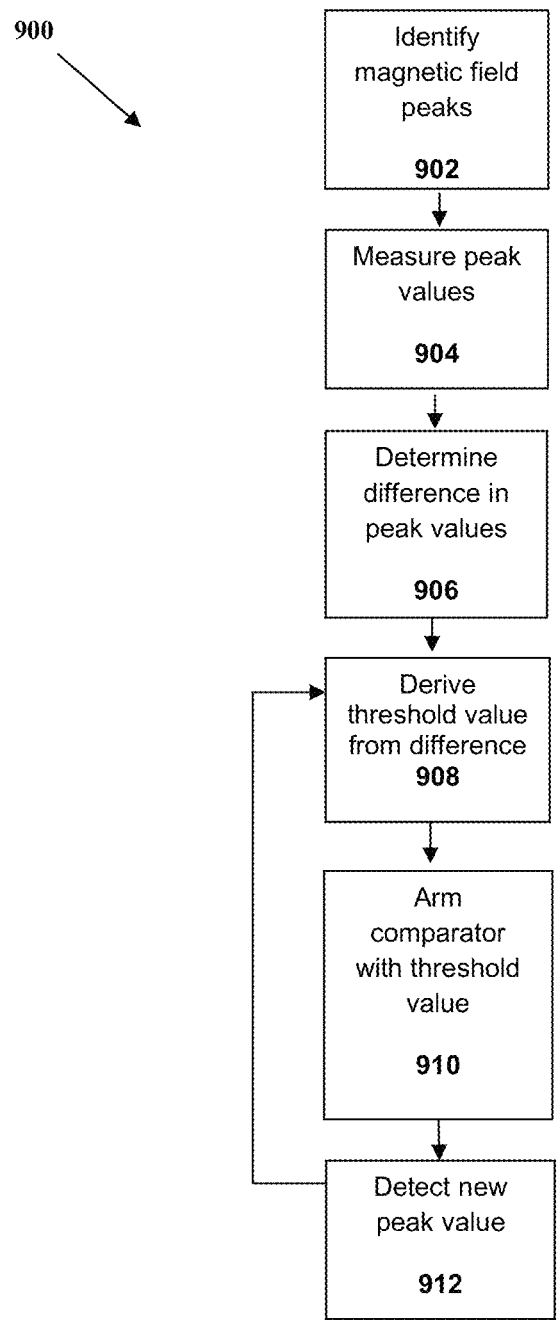
FIG. 9 is a block diagram of a method related to an embodiment.

In operation, and referring to FIG. 9, a method 900 can be implemented. Embodiments of method 900 can include more or fewer of the tasks depicted in FIG. 9, with method 900 being one example method. In general, an approach can be to identify sensor signals with the following features: (1) a first value, such as a positive or negative peak value (e.g., an extremum), before an edge of the target passes the sensor system; (2) a different second value after the edge has passed the sensor system; (3) a monotonous behavior (i.e., rising or falling) in a sufficiently large interval around the position where the edge of the target is exactly below the center of the sensor system; (4) the first value depends significantly on a size of the air-gap and strength of the magnet; and (5) the second value does not depend on the size of the air-gap or the strength of the magnet 108, or rather its dependency is at least much less than the one of the first value. Under these boundary conditions, the sensor system can detect the exact instant when the edge passes below the center of the sensor system as in FIG. 9.

At 902, the sensor system identifies output signals that have a peak corresponding to the related magnetic field, for example, by utilizing a peak detector circuit. At 904, the sensor system measures the value of the peak, wherein the peak value depends on a size of the air-gap and a strength of the magnet. The air-gap dependence can dominate because the magnet is fixed and generally changes only due to temperature and lifetime drifts (which in embodiments can be estimated with reasonable accuracy by a temperature measurement of the sensor system). Thus, the peak value provides a fairly good estimation of the size of the air-gap.

At 906, the sensor system determines a difference between the measured peak value (i.e., first peak value) and a second value after the edge has passed, as discussed above. The second value can be a fixed value (i.e., determined by construction only) or a measured value (i.e., a value that was measured and stored in a preceding operation). In embodiments, however, the configuration of the magnet and the sensor system is such that the second value is approximately zero. In such a configuration, task 906 can be omitted, and the first peak value can be used exclusively, which can also provide a higher phase accuracy.

At 908, the sensor system derives a threshold value on the basis of the determined difference. The threshold value can be determined in embodiments using a formula that outputs the threshold value as a function of the determined difference. The threshold value can also be determined by a look-up table. Either the look-up table or the formula can be derived by numerical simulation or by characterization in development or manufacturing; in general they can be derived during the development of the sensor system to take account of systematic dependencies between magnet 108, the sensor system, and the expected target, as well as environmental influences such as temperature. For example, in the case of temperature, both the determined difference and temperature can be used as inputs in the derivation of the threshold value. The sensor system can combine the determined difference with values of determined differences that are stored in memory circuitry or that were programmed into memory circuitry during a calibration run. An alternative approach is to combine the determined difference with values of the determined difference that were obtained during a preceding operation, wherein such a combination can be a moving average or some kind of filtering. This combination, for example, can have the goal to make the threshold value more robust against noise and interference, disturbances, or mechanical vibrations that can corrupt single measurements.

At 910, the sensor system compares the threshold value with other detected values. This can be done, for example, by applying the derived threshold value to a comparator, which then arms the comparator. The sensor system then waits until the comparator switches or until it detects a new measured peak value (i.e., when the rotational direction of the target is reversed, such that instead of a transition from a first position to a second position, the target transitions from a second position to a first position) at 912. In the latter case, the sensor system can disable the comparator and determine a new threshold value for the new measured peak value.

Thus, in an embodiment a sensor system can be configured to provide an output signal when a target crosses a position, the target being moveable along a path comprising the position. The sensor system can comprise at least one sensor element configured to output a signal, related to the target position, that exhibits a relative peak or extremum. Circuitry coupled to the at least one sensor element can be configured to derive a threshold based on the signal from the at least one sensor element, and provide the sensor system output signal when the signal from the at least one sensor element either decreases below the threshold if the relative extremum was a relative maximum or increases above the threshold if the relative extremum was a relative minimum.

Advantages of embodiments of the sensor systems, methods and devices discussed herein include more accurate edge detection, even for the first edge that occurs after power-on of the sensor. Conventional sensors use fixed thresholds shortly after power on, or even permanently, and these thresholds are not as accurate because they are prone to changes in air-gap and drift of magnet parameters. Another advantage is that embodiments can detect the true phase of the target device (e.g., a cam wheel), which means that embodiments can switch exactly when the tooth-gap (i.e., falling edge) or gap-tooth (i.e., rising edge) transition passes the center of the sensor systems. Conventional systems, in contrast, have small shifts against this; their thresholds cause the sensor output to toggle shortly before a rising edge and shortly after a falling edge, whereby "shortly" can mean about 0.5 degrees up to about 1.5 degrees of cam shaft position.

In practice, a specific magnetic field component, e.g. Bz, may not fulfill all of the requirements for both rising and falling edges; for example, it may fulfill the requirements only for rising iron edges. Another magnetic field component, however, such as, e.g., Bx, may fulfill the requirements only for falling edges, not for rising ones. Thus, embodiments can use one magnetic field component for rising edges and another one for falling edges.

In embodiments, magnetic field sensor systems or portions thereof can comprise integrated circuits, in which the sensor elements, circuitry and other components can be formed in, on or of a portion or "chip" of semiconductor material. ICs can be formed on a die, and the die and other components can be arranged in a package in embodiments. Embodiments discussed herein therefore can have advantages associated with integrated circuits, including small and compact size, improved performance over discrete components, and/or improved cost-effectiveness.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic field sensor system configured to be arranged spaced apart from a target by an air gap distance, the system comprising:
    a substrate;
    a first sensor element arranged on the substrate and being sensitive to a magnetic field component in a first direction;
    a second sensor element arranged on the substrate and being sensitive to a magnetic field component in a second direction different from the first direction; and
    circuitry, comprising:
        a memory configured to store a first threshold and a second threshold;
        electronic components configured to:
            compare a first signal derived from the first sensor element with the first threshold to detect a rising edge of the target;
            output a signal indicative of a position of the target based on the detected rising edge;
            identify a first peak value in the first signal;
            determine a subsequent first threshold based at least on a difference between the first peak value and a first subsequent value corresponding to a target position different than a position at which the first peak value occurs; and
            store the subsequent first threshold in the memory; or read the second threshold from the memory;
            compare a second signal derived from the second sensor element with a second threshold to detect a falling edge of the target;
            output a signal indicative of a position of the target based on the detected falling edge;
            identify a second peak value in the second signal;
            determine a subsequent second threshold based at least on a difference between the second peak value and a second subsequent value corresponding to a target position different than a position at which the second peak value occurs; and
            store the subsequent second threshold in the memory.

2. The sensor system of claim 1, wherein the first and second sensor elements comprise at least one of a vertical Hall sensor device or a magnetoresistive sensor device, and wherein the first sensor element comprises a Hall plate device.

3. The sensor system of claim 1, wherein at least one of the first sensor element or the second sensor element comprises a plurality of sensor element portions having a plurality of sensitivity directions.

4. The sensor system of claim 1, further comprising a bias magnet coupled to the substrate and configured to provide a bias magnetic field to magnetize the target and cause a variation in a magnetic field of the target when the target moves relative to the bias magnet.

5. The sensor system of claim 1, wherein the subsequent first value corresponds to a target position after an edge of the signal derived from the first sensor element has passed and the subsequent second value corresponds to a target position after an edge of the signal derived from the second sensor element has passed.

6. The sensor system of claim 1, wherein the system comprises n total sensor element portions arranged circumferentially about an axis, wherein n is a positive integer greater than 2.

7. The sensor system of claim 1:
    wherein the first sensor element comprises a first sensor element portion and a second sensor element portion;
    wherein the second sensor element comprises a first sensor element portion and a second sensor element portion; and
    wherein the first sensor element portion of the first sensor element and the first sensor element portion of the second sensor element are arranged closer to the target than the second sensor element portion of the first sensor element and the second sensor element portion of the second sensor element.

8. The sensor system of claim 1, wherein the first sensor element comprises a first sensor element portion and a second sensor element portion forming a first gradiometer having a first gradiometric direction.

9. The sensor system of claim 8, wherein the second sensor element comprises a third sensor element portion and a fourth sensor element portion forming a second gradiometer having a second gradiometric direction.

10. The sensor system of claim 9, wherein the first gradiometric direction and the second gradiometric direction are parallel.

11. A magnetic field sensor system configured to be arranged spaced apart from a target by an air gap distance, the system comprising:
    a substrate;
    a first sensor element arranged on the substrate and being sensitive to a magnetic field component in a first direction, wherein the first sensor element comprises a first sensor element portion and a second sensor element portion forming a first gradiometer having a first gradiometric direction, wherein the first sensor element portion comprises a Hall plate device;
    a second sensor element arranged on the substrate and being sensitive to a magnetic field component in a second direction different from the first direction, wherein the second sensor element comprises a third sensor element portion and a fourth sensor element portion forming a second gradiometer having a second gradiometric direction; and
    circuitry configured to indicate a sensed position of the target by comparing a signal derived from the first sensor element with a first threshold if the target moves from a first position to a second position, and comparing a signal derived from the second sensor element with a second threshold if the target moves from the second position to the first position; and
    wherein the second, the third, and the fourth sensor element portions and a fifth sensor element portion comprise one of a vertical Hall sensor device or a magnetoresistive sensor device.

12. A method to generate an output signal that indicates a sensed position of a target, the method comprising:

comparing a first signal derived from a first sensor element with a first threshold to detect a rising edge of the target, wherein the first sensor element is arranged on a die spaced apart from the target by an air gap distance and is sensitive to a magnetic field component in a first direction;

outputting a signal indicative of a position of the target based on the sensed rising edge;

identifying a first peak in the first signal;

determining a subsequent first threshold based at least on a difference between the first peak value and a first subsequent value corresponding to a target position different than a position at which the first peak value occurs; and storing the subsequent first threshold in a memory for use in detecting a subsequent rising edge;

or comparing a second signal derived from a second sensor element with a second, different threshold to detect a falling edge of the target, wherein the second sensor element is arranged on the die spaced apart from the target by the air gap and is sensitive to a magnetic field component in a second direction different from the first direction;

outputting a signal indicative of a position of the target based on the sensed falling edge;

identifying a second peak in the second signal;

determining a subsequent second threshold based at least on a difference between the second peak value and a second subsequent value corresponding to a target position different than a position at which the second peak value occurs; and storing the subsequent second threshold value in the memory for use detecting a subsequent falling edge.

13. The method of claim 12, wherein the first sensor element comprises a first sensor element portion comprising a Hall plate device and the second sensing element comprises a second sensor element portion comprising at least one vertical Hall sensor device or magnetoresistive sensor device.

14. The method of claim 12, wherein at least one of the first sensor element or the second sensor element comprises a plurality of sensor element portions having a plurality of sensitivity directions.

15. The method of claim 12, wherein the first direction and the second direction intersect to form an angle other than 0 degrees or 180 degrees.

16. The method of claim 15, wherein the first direction and the second direction are perpendicular.

* * * * *